United States Patent

McCann

[15] 3,706,129

[45] Dec. 19, 1972

[54] INTEGRATED SEMICONDUCTOR RECTIFIERS AND PROCESSES FOR THEIR FABRICATION

[72] Inventor: Joseph A. McCann, Auburn, N.Y.

[73] Assignee: General Electric Company

[22] Filed: July 27, 1970

[21] Appl. No.: 58,271

[52] U.S. Cl. ........................................29/583, 29/588
[51] Int. Cl. ................................................B01j 17/00
[58] Field of Search................................29/580, 583

[56] References Cited

UNITED STATES PATENTS

| | | | |
|---|---|---|---|
| 3,276,105 | 10/1966 | Alais et al. | 29/588 |
| 3,535,773 | 10/1970 | Bakker et al. | 29/580 |
| 3,535,774 | 10/1970 | Baker | 29/580 |
| 3,608,186 | 4/1971 | Hutson | 29/583 |

*Primary Examiner*—Charles W. Lanham
*Assistant Examiner*—W. Tupman
*Attorney*—Robert J. Mooney, Nathan J. Cornfeld, Carl O. Thomas, Frank L. Neuhauser, Oscar B. Waddell and Joseph B. Forman

[57] ABSTRACT

A wafer is diffused along opposite surfaces with bands of alternating conductivity type so that a band on one major surface is aligned with a band of an opposite conductivity type on the opposite major surface. Grooves are formed to separate bands along one major surface while grooves are formed at substantially right angles on the opposite major surface. The wafer may then be sub-divided along the grooves to form integrated rectifier units formed of unitary semiconductive elements. Contacts associated with one major surface may be utilized to provide a thermally conductive path to a thermally conductive, electrically insulative surface of a substrate. The contacts and a passivant associated with the semiconductive element together encapsulate the semiconductive element.

8 Claims, 11 Drawing Figures

FIG. 1.
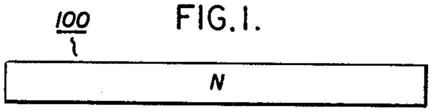
FIG. 3. FIG. 2. FIG. 4.
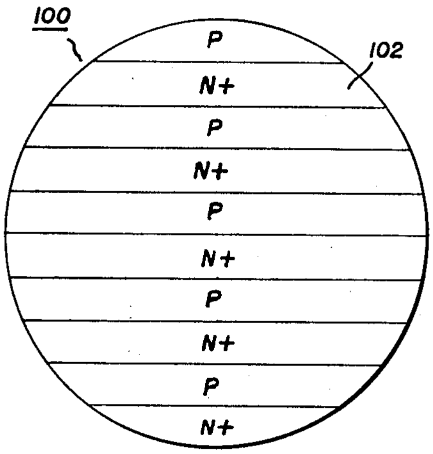
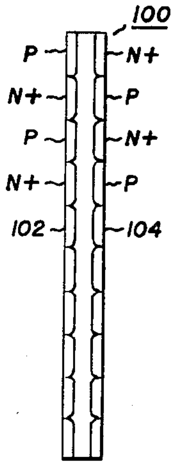
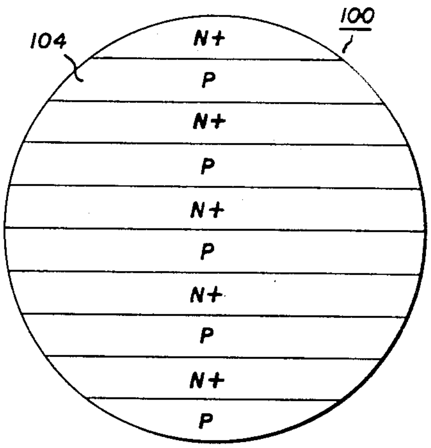
FIG. 6. FIG. 5. FIG. 7.
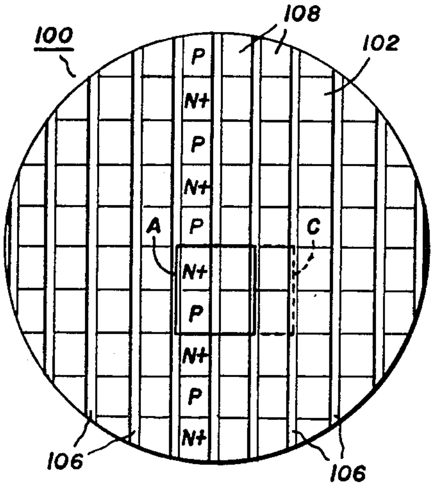
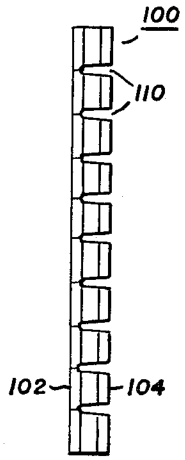
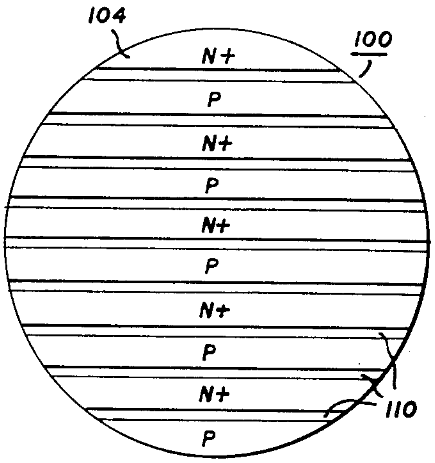
INVENTOR:
JOSEPH A. McCANN,
BY Carl O. Thomas
HIS ATTORNEY.

INVENTOR:
JOSEPH A. McCANN,
BY Carl O. Thomas
HIS ATTORNEY.

INTEGRATED SEMICONDUCTOR RECTIFIERS AND PROCESSES FOR THEIR FABRICATION

My invention relates to integrated semiconductor rectifiers, particularly power level rectifier bridges, and to processes for their fabrication.

It has been recognized prior to my invention that multiple rectifiers may be integrated within a single semiconductive element. Multiple rectifiers have been most commonly included in a signal integrated circuits by processes generally compatible with processing of other active semiconductor signal elements. For example, integrated rectifiers are most commonly formed in signal circuits by planar diffusion techniques. Where signal integrated circuit type processing, such as planar diffusion, has been employed the integrated rectifiers do not possess adequate voltage blocking characteristics for most power handling applications. Also, internal power losses may be excessive producing difficulties in removing heat and/or meeting electrical criteria for forward bias.

While specialized designs have been proposed for integrated power rectifiers, these designs have been of a rather customized nature requiring individual handling and processing of each integrated rectifier unit. Although the handling of an integrated rectifier unit could under proper circumstances constitute an advance over discrete rectifier processing, the significant economies of multiple unit processing which are commonly achieved by processing many later divisible units simultaneously within a single wafer, as is common in processing of signal level devices, have been largely unrealized.

It is an object of my invention to provide a process for fabricating from a single semiconductive wafter an integrated rectifier unit, particularly an integrated bridge rectifier unit.

It is a second object of my invention to provide an integrated rectifier unit, particularly an integrated bridge rectifier unit, which is capable of efficient use in power handling applications.

These and other objects of my invention may be realized in one aspect by a process of forming semiconductive units comprising, forming in a semiconductive wafer over a first major surface a plurality of regularly spaced bands of a first conductivity type interleaved with bands of an opposite conductivity type. Over a second, opposed major surface a plurality of regularly spaced bands of the first conductivity type are formed interleaved with bands of the opposite conductivity type. The bands of the first conductivity type at the first major surface are aligned with bands of the opposite conductivity type at the second major surface, whereby a rectifying junction is formed by the bands within the wafer between each pair of opposed bands. Grooves are formed in the first major surface to a depth sufficient to intersect the rectifying junctions. The grooves are located at the intersection of adjacent bands. Grooves are formed in the second major surface to a depth sufficient to intersect the rectifying junctions. The grooves are arranged in laterally spaced rows and separate at least a portion of the bands on the second major surface into a plurality of laterally spaced segments. The wafer is sub-divided along the grooves to form semiconductive units from the wafer.

In another aspect my invention is directed to a monocrystalline semiconductive element having first and second opposed major surfaces and having a groove opening toward the first major surface comprised of a first zone of a first conductivity type lying adjacent the first major surface and bounded on one edge by the groove. A second zone of a second conductivity type lies adjacent the first major surface and is separated from the first zone by the groove. A third zone of the second conductivity type overlies the first zone and forms a rectifying junction therewith, and a fourth zone of the first conductivity type overlies the second zone and forms a rectifying junction therewith.

My invention may be better understood by reference to the following detailed description considered in conjunction with the drawings, in which FIG. 1 is an edge view of a wafer utilized as the starting element for the practice of my invention;

FIG. 2 is an edge view of the wafer of FIG. 1 after diffusion;

FIGS. 3 and 4 are elevations of the opposite major surfaces of the wafer of FIG. 2;

FIG. 5 is an edge view of the wafer of FIG. 2 after grooving;

FIGS. 6 and 7 are elevations of the opposite major surfaces of the wafer of FIG. 5;

Figure 9:
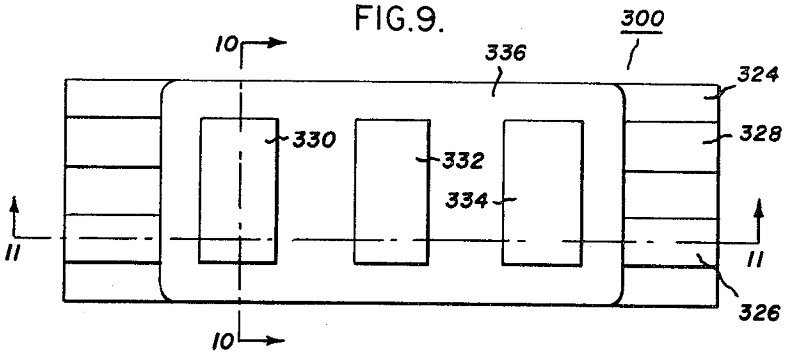
Figure 10:
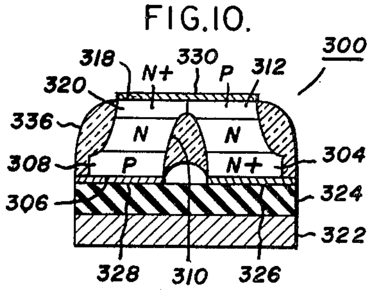
Figure 11:
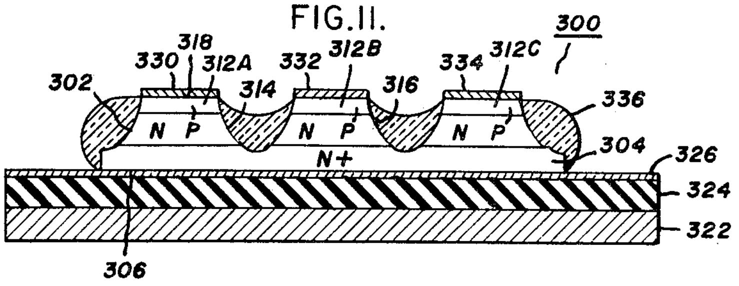

FIG. 9 is a plan view of a semiconductor module formed according to my invention; and FIGS. 10 and 11 are sectional views taken along section lines 10—10 and 11—11, respectively, in FIG. 9.

In the drawings the semiconductive elements are not sectioned in order to avoid cluttering the drawings. Further, for ease of illustration, the thickness of the wafers and semiconductive elements is greatly exaggerated as compared to their length and width.

As a starting element for the practice of my invention I prefer to utilize a semiconductive wafer. Semiconductive wafers are thin slices of monocrystalline semiconductive material having lateral dimensions which are large as compared with their thickness. A semiconductive wafer typically exhibits a maximum lateral dimension in the range of from 0.5 to 2.0 inches, which is controlled by the dimensions of the crystal from which the wafer is formed. The thickness of the wafer may range from the minimum thickness that can be practically handled in processing without excessive risk of breakage, typically less than 5 mils (0.005 inch), to a maximum thickness of about 20 mils (0.020 inch), the maximum wafer thickness typically being determined principally by the maximum voltage blocking capability ultimately desired. The wafer utilized as a starting element will in most cases have a low impurity concentration of net N or P type characteristic. While it is preferred in theory to utilize as a starting element a wafer of intrinsic semiconductive material, for practical applications the wafer is merely chosen to approximate intrinsic semiconductive material to the degree necessary to yield the desired electrical characteristics, as is well understood in the art. For most power handling applications it is preferred that the wafer be formed of silicon, although my invention is generally applicable to monocrystalline semiconductive materials. For purposes of illustration the wafer 100 is shown in FIG. 1 as having a low impurity concentration of N type impurity characteristic.

The wafer 100 is shown in FIGS. 2 through 4 inclusive as it appears after diffusing in N and P type impurities to form a plurality of bands adjacent the opposite major surfaces 102 and 104. On each major surface the bands of P conductivity type are alternated with bands of $N^+$ conductivity type. P conductivity type bands on each major surface are aligned with $N^+$ conductivity type bands on the opposite major surface. Accordingly a rectifying junction lies between each band and the band aligned with it on the opposite major surface. The bands may be formed by masking the opposite surfaces of the wafer to leave laterally spaced bands exposed. An impurity of first conductivity type can then be diffused into the wafer to form bands of a corresponding conductivity type in the wafer. Thereafter, the areas of the wafer initially exposed can be masked and the areas of the wafer initially masked can be exposed. A second diffusion with an opposite conductivity type impurity completes the formation of the wafer as shown in FIGS. 2 through 4 inclusive. As is well understood in the art, both the $N^+$ and P conductivity type bands may be simultaneously formed by utilizing an impurity source such as gallium arsenide. Hence, it is possible by techniques well known to the art to form the wafer with $N^+$ and P conductivity type bands as shown in FIGS. 2 through 4 inclusive merely by employing a single masking step and a single diffusion step.

After diffusion the wafer 100 is provided with grooves to laterally isolate adjacent bands or zones along one major surface and to segment the bands or zones along the opposite major surface. As shown in FIG. 6 a plurality of laterally spaced, substantially parallel grooves 106 are provided in the wafer opening toward the major surface to separate the P and $N^+$ conductivity type bands or zones diffused into this major surface into laterally spaced segments. The grooves 106 extend to a depth sufficient to isolate the rectifying junctions associated with each row 108 of contiguous band segments from the rectifying junctions associated with the laterally adjacent rows. This means that the grooves 106 extend into the wafer to a depth sufficient to intersect the bands or zones diffused into the wafer from the opposite major surface. As shown in FIGS. 5 and 7 a plurality of laterally spaced, substantially parallel grooves 110 are provided in the wafer opening toward the major surface 104. The grooves 110 are positioned to provide lateral isolation between adjacent bands or zones and, of course, displace the portions of the wafer which initially form lateral junctions between adjacent zones. The grooves 110 extend to a dept sufficient to isolate the junction associated with each zone adjacent the major surface 102 from that of the laterally adjacent zone. Accordingly the grooves 110 extend to a depth sufficient to intersect the zones formed adjacent the major surface 102. Since both the grooves 106 and 110 normally extend into the wafer to a depth greater than one half the thickness of the wafer, the grooves opening toward the opposite major surfaces intersect and form apertures at their points of intersection. For ease of illustration the apertures are not shown in FIGS. 6 or 7. The grooves may be formed by etching or by sawing. Where etching is utilized the portions of the major surfaces not displaced by the grooves are masked. According to one technique contacts may be deposited on the opposite major surfaces to serve as masks for subsequent etching of the grooves.

After groove formation the wafer may be subdivided along the grooves to form a plurality of semiconductive units. The smallest integrated rectifier elements according to my invention are formed by sub-dividing the wafer along all the grooves 106 and along alternate grooves 110. To form integrated rectifier bridge units the wafer may be sub-divided along both alternate grooves 106 and alternate grooves 110. To form three phase integrated rectifier bridge units the wafer may be sub-divided along alternate grooves 110 and every third groove 106.

Figure 8:
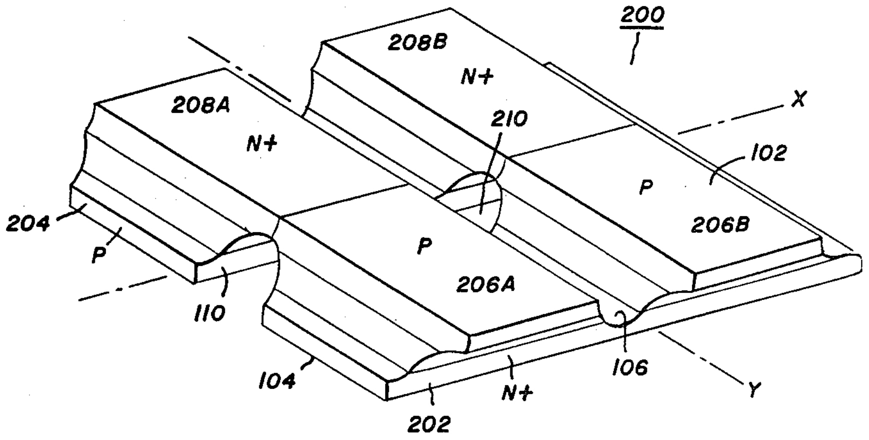
FIG. 8 is an isometric view of a semiconductive element formed according to my invention.

In FIG. 8 a rectifier bridge unit 200 is illustrated which is formed from the portion of the wafer 100 shown in FIG. 6 defined by the boundary A. The bridge unit is formed as a single monocrystalline semiconductive element. A first zone 202 lies adjacent the major surface 104 and is laterally separated from a second zone 204 by an included portion of the groove 110, which opens toward this major surface. The first zone is shown as $N^+$ conductivity type while the second zone is shown as P conductivity type. A third zone of P conductivity type is divided by an included portion of a groove 106 opening toward major surface 102 into a first segment 206A and a second, laterally spaced segment 206B. A fourth zone of $N^+$ conductivity type is divided by the groove 106 into a first segment 208A and a second segment 208B. The included portions of the grooves 106 and 110 intersect to form an aperture 210 centrally within the unit. Since the first zone and the third zone segments which overlie it are of opposite conductivity types, rectifying junctions are formed between each of the third zone segments and the first zone. Similarly, rectifying junctions are formed between each of the fourth zone segments and the underlying second zone.

An axis X is shown in FIG. 8 located in the trough of the included portion of groove 110 while an axis Y is shown located in the trough of the included portion of the groove 106. It can be readily seen that a separate rectifier portion of the rectifier bridge unit lies in each of the four quadrants defined by the intersecting X and Y axes. Each of the rectifier portions have a separate rectifying junction therein. It is appreciated that the rectifier bridge unit shown could, if desired, be sub-divided along the Y axis to form two identical integrated rectifier units according to my invention. The two integrated rectifier units could be utilized together to serve the same purposes as the rectifier bridge unit, although it is contemplated that in most applications it will be advantageous to process and utilize the rectifier bridge unit as a single element rather than as a pair of elements. Where three phase applications are desired, the rectifier bridge unit may be enlarged by extending the boundary of the unit sub-divided from the wafer along the dashed line C as shown in FIG. 6. In such instance the three phase rectifier bridge unit would appear as shown in FIG. 8, but with the third and fourth zones divided into three segments each by two included portions of grooves 106, rather than into two segments by one included portion of a groove 106 as shown. To provide for higher multi-phase rectification it is merely necessary to provide additional segments of the third and fourth zones.

A preferred semiconductor module construction according to my invention is shown in FIGS. 9 through 11 inclusive. The semiconductor module 300 is shown provided with a monocrystalline semiconductive element 302 which is a three phase integrated rectifier bridge unit constructed as described above. The element 302 is comprised of a first zone 304 of $N^+$ conductivity type lying adjacent a first major surface 306. A second zone 308 of P conductivity type is laterally spaced from the first zone by a groove 310 opening toward the first major surface. A third zone 312 of P conductivity type overlies the first zone. The third zone is sub-divided by laterally spaced grooves 314 and 316 into three laterally spaced segments 312A, 312B, and 312C. The third zone lies adjacent a second major surface 318. A fourth zone 320 overlies the second zone and is sub-divided by the grooves 314 and 316 into three laterally spaced segments, similarly as the third zone. A separate rectifying junction is formed between each segment of the third zone and the first zone. In like manner a separate rectifying junction is formed between each segment of the fourth zone and the second zone.

In order to provide for heat removal of the semiconductive element a substrate 322 is provided which is both electrically and thermally conductive. Typically the substrate 322 is formed of copper or a similar highly thermally conductive metal. Bonded to one major surface of the substrate is layer 324 of an electrically insulative, thermally conductive material, such as aluminum nitride, beryllia, alumina, boron nitride, etc. Where the layer 324 is quite thin—that is, with a thickness of less than 5 mils—the layer 324 may be formed of a synthetic resin, such as Teflon, Mylar, etc., known to be an excellent electrical insulator.

First and second contacts 326 and 328 are provided in laterally spaced relation forming a low impedance thermally and electrically conductive interconnection to the first and second zones, respectively. The first and second contacts additionally provide a low impedance thermally conductive path to the layer 324. The first and second contacts serve as output contacts for the bridge module. First, second, and third input contacts 330, 332, and 334 are electrically conductively associated with the first, second, and third segments, respectively, of the third and fourth zones. Each of the input contacts overlies segments of the third and fourth zones that are contiguous. A protective passivant 336 is located within the grooves and peripherally surrounds the semiconductive element to overlie the rectifying junctions at their intersections with the surfaces of the element. In the preferred form the passivant is formed of a material such as glass which is capable of acting as the entire insulative packaging portion of the module. In the form shown it can be seen that the passivant and contacts together encapsulate the semiconductive element. It is appreciated that other known passivants, such as oxides, nitrides, silicone varnishes and rubbers, epoxy resins, etc., may be employed instead of glass as a passivant and that these passivants may be utilized with other known packaging arrangements, such as molded plastic casements, hermetically sealed metal containers, etc.

In use of the module 300, the substrate 322 is fastened to a heat receiving body which may be a heat exchanger or a chassis. The semiconductive element 302, while thermally coupled through the first and second contacts 326 and 328 to the substrate, is electrically isolated from the substrate. In a typical application the three leads of a three phase alternating current source may be attached one to each of the input contacts 330, 332, and 334. The first and second contacts serve as the direct current output leads for the module. Direct current receiving leads may be attached to the portions of the first and second contacts extending laterally beyond the semiconductive element. The semiconductive element, although one piece, performs the same electrical function as six discrete diodes in a three phase full wave bridge. Further, by utilizing glass as both the passivant and insulative packaging material the rectifying junctions within the semiconductive element can be protected against excessive surface field gradients so that they are capable of appreciable reverse voltages.

While I have shown the module 300 as a three phase bridge unit, it is appreciated that the module could be readily converted to a single phase bridge unit merely by substituting the semiconductive element 200 for the semiconductive element 302. Alternately, a module having an integrated rectifier element could be formed by utilizing only the portion of the semiconductive element 200 lying to the left of the Y axis in FIG. 8. While I have shown the output contacts providing a thermally conductive path to the substrate, it is appreciated that the semiconductive element could be inverted, so that the direct current or input contacts provide the thermally conductive path from the semiconductive path to the substrate. For many module applications the substrate 322 may be omitted entirely and the layer 324 fastened directly to a chassis or heat exchanger. While the contacts are for simplicity shown as single metal layers, it is appreciated that any conventional single or multiple layer contact system may be utilized. Instead of utilizing a nearly intrinsic wafer as a starting element the wafer may be initially uniformly doped to the desired level with either a P or N impurity and thereafter diffusion along bands performed with only the opposite conductivity type impurity. Instead of diffusing an impurity into the wafer to form the bands or zones these may be formed by alloying. Still other variations will readily occur to those skilled in the art apprized of my invention. It is accordingly intended that the scope of my invention be determined by reference to the following claims.

What I claim and desire to secure by Letters Patent of the United States is:

1. A process of forming semiconductive units comprising forming in a semiconductive wafer over a first major surface a plurality of regularly spaced bands of a first conductivity type interleaved with bands of an opposite conductivity type, forming in the semiconductive wafer over a second, opposed major surface a plurality of regularly spaced bands of the first conductivity type interleaved with bands of the opposite conductivity type, the bands of the first conductivity type at the first major surface being aligned with bands of the opposite conductivity type at the second major surface, whereby a rectifying junction is formed by the bands within the wafer between each pair of opposed bands, forming grooves in the first major surface to a depth sufficient to intersect the rectifying junctions, the grooves being located at the intersection of adjacent bands, forming grooves in the second major surface to a depth sufficient to intersect the rectifying junctions, the grooves being arranged in laterally spaced rows and separating at least a portion of the bands on the second major surface into a plurality of laterally spaced segments, and sub-dividing the wafer along the grooves to form semiconductive units from the wafer.

2. A process according to claim 1 in which the bands of the first conductivity type are simultaneously formed adjacent the first and second surfaces by masking the wafer along regularly spaced bands over the first and second surfaces with the bands on the opposed surfaces being misaligned and thereafter diffusing an impurity of the first conductivity type into the wafer portions not masked.

3. A process according to claim 1 in which contact metallization is applied to the first and second major surfaces prior to forming the grooves.

4. A process according to claim 1 in which contact metallization is applied to at least one of the major surfaces in laterally spaced bands and the metallization bands are used as masks in forming grooves.

5. A process according to claim 1 in which the wafer is sub-divided so that at least one of the semiconductive sub-units is bounded by surface portions of initially non-adjacent grooves along opposite edges and includes an undisturbed groove segment within its periphery.

6. A process according to claim 1 in which the wafer is sub-divided so that at least one of the semiconductive sub-units is bounded on all opposite edges by surface portions of initially non-adjacent grooves and includes undisturbed groove segments within its periphery adjacent both its first and second major surfaces.

7. A process according to claim 1 in which a protective passivant is applied to the grooves prior to subdividing the wafer.

8. A process according to claim 1 in which portions of the sub-units adjacent the first and second major surfaces are provided with contacts and the remaining surfaces of the sub-units are protectively encapsulated by a dielectric passivant.

* * * * *